United States Patent
Ho et al.

(10) Patent No.: US 7,426,139 B2
(45) Date of Patent: Sep. 16, 2008

(54) DYNAMIC PROGRAM AND READ ADJUSTMENT FOR MULTI-LEVEL CELL MEMORY ARRAY

(75) Inventors: Wen Chiao Ho, Tainan (TW); Chin Hung Chang, Tainan (TW); Kuen-Long Chang, Taipei (TW); Chun Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 111 days.

(21) Appl. No.: 11/555,849

(22) Filed: Nov. 2, 2006

(65) Prior Publication Data

US 2008/0123406 A1    May 29, 2008

(51) Int. Cl.
  *G11C 16/04*  (2006.01)
(52) U.S. Cl. ............................. 365/185.03; 365/185.22
(58) Field of Classification Search ............ 365/185.03, 365/185.12, 185.22, 185.24
  See application file for complete search history.

(56) References Cited

U.S. PATENT DOCUMENTS

| | | | |
|---|---|---|---|
| 6,538,923 B1 | 3/2003 | Parker | |
| 6,714,457 B1 | 3/2004 | Hsu et al. | |
| 6,836,432 B1 | 12/2004 | Parker et al. | |
| 7,330,376 B1* | 2/2008 | Chen et al. | 365/185.24 |
| 2006/0098483 A1* | 5/2006 | Chen et al. | 365/185.03 |
| 2006/0164884 A1* | 7/2006 | Wu | 365/185.03 |

OTHER PUBLICATIONS

Eitan, et al., "4-bit per Cell NROM Reliability," Electron Devices Meeting, 2005. IEDM Technical Digest. IEEE International, Volume , Issue , Dec. 5, 2005 pp. 539-542.
Polansky, et al., "A 4b/cell NROM 1Gb Data-Storage Memory," ISSCC 2006, Session 7, Non-Volatile Memory paper 7.1.

* cited by examiner

*Primary Examiner*—Vu A Le
(74) *Attorney, Agent, or Firm*—Haynes Beffel & Wolfeld LLP

(57) ABSTRACT

A method for operating a multi-level cell ("MLC") memory array of an integrated circuit ("IC") programs first data into a first plurality of MLCs in the MLC memory array at a first programming level. Threshold voltages for the first plurality of MLCs are sensed, and an adjust code is set according to the threshold voltages. Second data is programmed into a second plurality of MLCs in the MLC memory array at a second programming level, the second plurality of MLCs having a program-verify value set according to the adjust code. In a further embodiment, a reference voltage for reading the second plurality of MLCs is set according to the adjust code.

22 Claims, 6 Drawing Sheets

DYNAMIC PROGRAM AND READ ADJUSTMENT FOR MULTI-LEVEL CELL MEMORY ARRAY

BACKGROUND OF THE INVENTION

1. Field of the Invention

The present invention relates to memory devices based on multi-level cells ("MLCs"), and more particularly to techniques for programming and reading MLC-based memory devices.

2. Description of Related Art

Conventional flash memory cells store charge on a floating gate. The stored charge changes the threshold voltage ($V_{th}$) of the memory cell. In a read operation, a read voltage is applied to the gate of the memory cell, and current through the cell indicates the programming state of the memory cell. For example, memory cell that conducts a first current value during a read operation might be assigned a digital value of "1", and a memory cell that conducts a first current value during a read operation might be assigned a digital value of "0". Charge is added to and removed from the floating gate to program and erase the memory cell, i.e., to change the stored value from 1 to 0. The charge is retained by the floating gate until the memory cell is erased, retaining the data state without continuously applied electrical power.

FIG. 1A shows a memory cell distribution versus threshold voltage Vth for a conventional memory array. Memory cells in a low Vt state have threshold voltages within a first range 102 and memory cells in a high Vt state have threshold voltages within a second range 100. A cell can be determined to fall within a low threshold range by measuring whether the threshold of the cell is lower than the maximum threshold for the range, where the maximum threshold can be defined as an erase verify EV level, A cell can be determined to fall within a high threshold range by measuring whether the threshold of the cell is higher than the minimum threshold for the range, where the minimum threshold can be defined as a program verify PV level. In practice the erase verify voltage may be slightly higher than the maximum of the range, and the program verify voltage may be slightly lower than the minimum of the range. In a conventional single-level cell ("SLC") memory, the read window WL used to distinguish low Vt cells in range 102 from high Vt cells in range 100 is the difference between a program-verify PV level and an erase-verify EV level. The distribution of unprogrammed, unerased SLCs $Vt_{INIT}$ can be different than the programmed or erased distributions as shown in a dashed line.

MLCs have been developed that can indicate (store) multiple data values by providing selectively different amounts of charge on the floating gate. MLCs increase the amount of data that can be stored on the same area of an IC compared to an SLC, increasing memory density. Basically, a little bit of negative charge slightly increases $V_{th}$ of an MLC, and more negative charge further increases $V_{th}$. A read operation is used to determine what state the memory cell has been charged (programmed) to.

FIG. 1B shows a memory cell distribution versus $V_{th}$ for an MLC memory array. The MLC has four levels, L0, which is the erased condition, and programming levels L1, L2, and L3, which are levels where increasing amounts of negative charge have been transferred to the charge trapping structures of the MLCs, increasing $V_{th}$ for each successive programming level. The read windows WL0-1, WL1-2, WL2-3 between levels depends on the Vth distribution of each programming level. In the MLC implementation, the data value corresponding to each of the four levels is a design choice. That is L0 to level L3 can map to (11, 01, 10, 00), (11, 01, 00, 10) or (11, 10, 00, 01), or others. Of course, to improve bit error count, a mapping like (11, 01, 00, 10) that results "just-one-bit-error while read shift one level" is often better.

Memory arrays incorporating MLCs are typically read in the well-known fashion of applying a read voltage (Vt) to a selected wordline, and comparing a voltage or current on the bitlines of a set of MLCs activated by the wordline to a reference. The reference is often produced using a reference cell having a selected thereshold voltage generally between the maximum Vth of a first programming level and the minim Vth of a second programming level. For example, the reference cell provides a reference current ($I_{REF}$) to a sense amplifier that compares the current from the MLC ($I_{MLC}$) to the current from the reference cell. If $I_{MLC}$ is higher than $I_{REF}$, then the sense amplifier provides a first output, and if $I_{MLC}$ is lower than $I_{REF}$, the sense amplifier provides a second output.

A typical read operation is page-based. For example, a two giga-bit ("2 Gb") memory device (or memory array in an IC) can be configured in 128,000 two-kilobyte ("2 KB") pages. An entire page may contain too many MLCs to simultaneously program because of device current limitations. Thus, a page can be further subdivided into "chunks" for programming, erasing and reading. A chunk is a convenient portion of a page for programming or other operations. For example, a 2 KB page can be subdivided into 16 chunks, each chunk having 128 Bytes.

FIG. 2 is a diagram of a system 200 illustrating a conventional program and read sequence. A user enters a program pattern 202 through an input buffer 204 into an SRAM buffer 206. The data from a chunk in the SRAM is programmed into a slot within a page 211 of an MLC memory array 212. After programming, a program verify operation is performed by reading the programmed values back 214 using a data transfer block 216 (e.g. sense amplifier array). A representative embodiment includes 64 sense amplifiers which are operated in parallel on a 64 cell block of data for the verify operation. For cells storing two bits of data, the 64 sense amplifiers are used for each of the four Vth distributions. The program verify results can be used to update the data in the SRAM buffer 206. If the read results match the program pattern in the SRAM, then the data is cleared. If the results do not match, then the data for un-matching bits remains set. If any bits remain set after the chuck has been programmed, then another programming pulse is applied to the MLCs using the data remaining in the SRAM, until successful programming is achieved for all four Vth levels, or a maximum number of retries.

The process is repeated until the whole chunk is programmed, and then repeated for each chunk until the whole page is programmed. Several other sequences are possible, but generally a chunk is programmed to the desired levels (see FIG. 1B, L1, L2, L3) and verified to confirm that the MLCs provide those desired levels when read. This is done for each chunk until the entire page passes program-verify.

During a read operation, the user obtains the page content by reading 214 the data stored in the MLC memory array 212. The results are written into the SRAM buffer 206, 64 cell block by 64 cell block until an entire chunk is read. The page data is delivered to an output buffer 218, and then the output data 220 is delivered to the user.

As the size of memory arrays increases, the process and operating variations across the array and across a page within an array increase as well, which in turn increase the width of Vth distributions. Wider Vth distributions reduce the margins between the levels for a given voltage headroom. It is desirable to provide a large margin between the Vth distributions for the multiple levels in a MLC in order to improve the reliability and speed of the reading and programming operations.

SUMMARY OF THE INVENTION

A method for operating a multi-level cell ("MLC") memory array of an integrated circuit ("IC") is based on the recognition that the Vth distribution over a chunk of data within an array can be much narrower than over the entire array, or over a page within an array. By more accurately determining a Vth distribution for data to be programmed or read, for groups of cells smaller than the entire array, such as chunks that are read in parallel within a page, improved performance is achieved.

A method described herein programs a data set including first data corresponding to a first programming level, second data corresponding to a second programming level, third data corresponding to a third programming level, and fourth data corresponding to a fourth programming level, into a block of MLC cells. The first data is programmed into a first plurality of MLCs, such as a chunk of MLCs, in the MLC memory array at a first programming level. Threshold voltages for the first plurality of MLCs are sensed (detected) over a range of threshold voltages for the first programming level, and an adjust code is set according to the maximum threshold voltage in the range for the first programming level. The sensed maximum threshold value in the distribution for the plurality of cells indicates the maximum Vth for the plurality of cells, and can be lower than the maximum of the distribution for the array. In a particular embodiment, the adjust code is a two-bit value (e.g. 00, 01, 10, 11), indicating 4 possible maximum threshold voltages for the first programming level. The second data is programmed into a second plurality of MLCs in the MLC memory array at a second programming level, using a program-verify value for the second programming level set according to the adjust code. In this manner, the minimum value for the distribution for the second programming level is set at a fixed margin above the maximum level of the distribution for the first programming level, as indicated by the adjust code. In a particular embodiment, the first plurality of MLCs is in a first chunk of a page of the MLC memory array and the second plurality of MLCs is in the first chunk.

In a further embodiment, a chunk adjust code that indicates adjust codes between the plurality of different programming levels of the MLCs in the chunk is stored. For example, a chunk of an MLC memory array having three programming levels and one erase level has a first adjust code between the erase level and level 1, a second adjust code between programming level 1 and programming level 2, and a third adjust code between programming level 2 and programming level 3.

In a further embodiment, the third data in the data set is programmed into a third plurality of MLCs in the MLC memory array at the first programming level. Second read voltages are sensed for the third plurality of MLCs, and a second adjust code is set according to the second read voltages. The fourth data is programmed into a fourth plurality of MLCs in the MLC memory array at the second programming level, the fourth plurality of MLCs having a second program-verify value set according to the second adjust code. In a particular embodiment, the plurality of MLCs is in a first chunk of a page of the MLC memory array, the second plurality of MLCs is in the first chunk, the third plurality of MLCs is in a second chunk of the page, and the fourth plurality of MLCs is in the second chunk.

In a particular embodiment, the adjust code is stored in the MLC memory array. In a further embodiment, the adjust code is stored in the MLC memory array using a single-level or one-bit-per-cell technique. In particular embodiments, an adjust code associated with a chunk of the MLC memory array is stored in memory cells accessed using the address of the chunk.

In a particular embodiment, the first programming level is within a first page programming level range extending between a first program verify level and a first erase verify level, the first page programming level range being divided into sub-ranges, the read voltages for the first plurality of MLCs providing a first chunk read voltage distribution having a first high boundary occurring in a sub-range of the first page programming level range, the adjust code being set according to the sub-range. The sub-ranges have the same width (i.e. same Vth range). Alternatively, the sub-ranges have different widths. In a particular embodiment, the first page programming level range is divided into four sub-ranges.

In yet a further embodiment, second threshold voltages are sensed for the second plurality of MLCs and a second adjust code is set according to the second threshold voltages. Third data is programmed into a third plurality of MLCs in the MLC memory array at a third programming level, the third programming level having a second program-verify value set according to the second adjust code. In a particular embodiment, the first plurality of MLCs, the second plurality of MLCs, and the third plurality of MLCs are in a chunk of a page of the MLC memory array. In a particular embodiment, a chunk adjust code including the first adjust code and the second adjust code is stored in the MLC memory array. In a particular embodiment, the adjust code is stored in the chunk or elsewhere in the MLC memory array using a single-level cell technique.

In a further embodiment, the program-verify value provides a first read window between the threshold voltages of the first plurality of MLCs and second threshold voltages of the second plurality of MLCs greater than a nominal read window between the first programming level and the second programming level. When used with multiple programming levels, the program-verify value provides a first read window between the threshold voltages of the first plurality of MLCs and second threshold voltages of the second plurality of MLCs, and the second program-verify value provides a second read window between the threshold voltages of the third plurality of MLCs and fourth threshold voltages of the fourth plurality of MLCs, each of the first read window and the second read window being greater than a nominal read window between a first programming level distribution and a second programming level distribution.

In a further embodiment, a first reference voltage is set according to the adjust code and the second plurality of MLCs is read using the first reference voltage In yet a further embodiment, a second reference voltage is set according to the second adjust code and the fourth plurality of MLCs is read using the second reference voltage.

In another embodiment, an integrated circuit ("IC") has a multi-level cell ("MLC") memory array and a program-verify adjustment block including a plurality of sense amplifiers associated with a corresponding plurality of sub-ranges of a threshold voltage distribution of a programming level of the MLC memory array and an evaluation unit receiving a plurality of bits corresponding to the plurality of sense amplifiers, the evaluation unit providing an adjust code according to the plurality of bits. In a particular embodiment, the read voltage distribution has at least two sub-ranges and the plurality of sense amplifiers includes a first sense amplifier coupled to a first reference indicating a program-verify boundary of the read voltage distribution and a second sense amplifier coupled to a second reference indicating a first adjust level between a first sub-range and a second sub-range. In a further embodiment, the read voltage distribution has four sub-ranges and the plurality of sense amplifiers includes a first sense amplifier coupled to a first reference indicating a program-verify boundary of the read voltage distribution, a second sense amplifier coupled to a second reference indicating a first adjust level between a first sub-range and a second sub-range, a third sense amplifier coupled to a third reference indicating a second adjust level between the second sub-range and a third sub-range, and a fourth sense amplifier coupled to a fourth reference indicating a third adjust level between the third sub-range and a fourth sub-range.

A new MLC program algorithm includes a dynamically determined program-verify level for a given portion of a memory array based on a maximum threshold value for a lower Vth boundary level within the same portion of the array, plus a read window margin. A new MLC program algorithm can apply a constant read window across the array with dynamically adjusted program verify levels. An adjust-code concept is used to record the lower level Vth boundary, and set the program verify level of the higher Vth level, for each portion of the array.

A new MLC read algorithm includes a dynamic reference according to the dynamically determined program verify levels. The adjust-code information is used to adjust the reference level in advance. Thus, a moving reference level method is adopted to increase the MLC read window.

Other aspects and advantages of the present invention can be seen on review of the drawings, the detailed description and the claims, which follow.

DETAILED DESCRIPTION

A detailed description of techniques for Vth margin search of MLC-based memory arrays is provided with reference to FIGS. 3A-10.

Figure 1A:
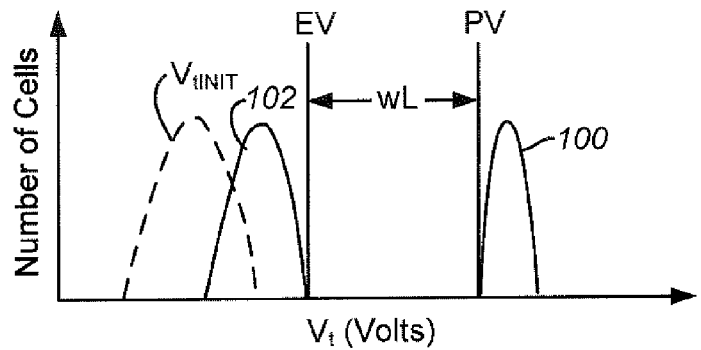
FIG. 1A shows a memory cell distribution versus Vth for a conventional memory array.
Figure 1B:
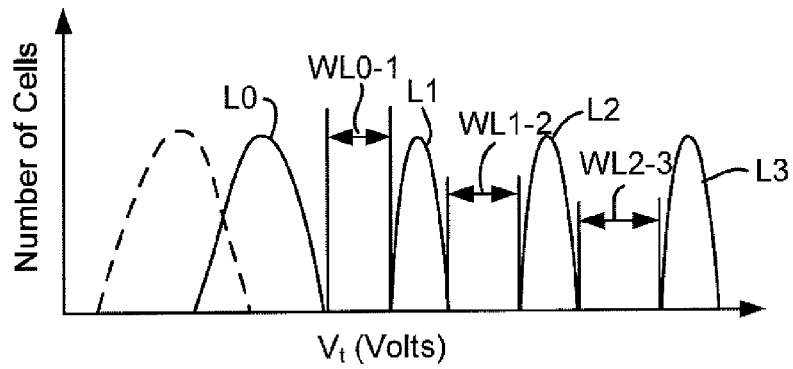
FIG. 1B shows a memory cell distribution versus Vth for an MLC memory array.
Figure 2:
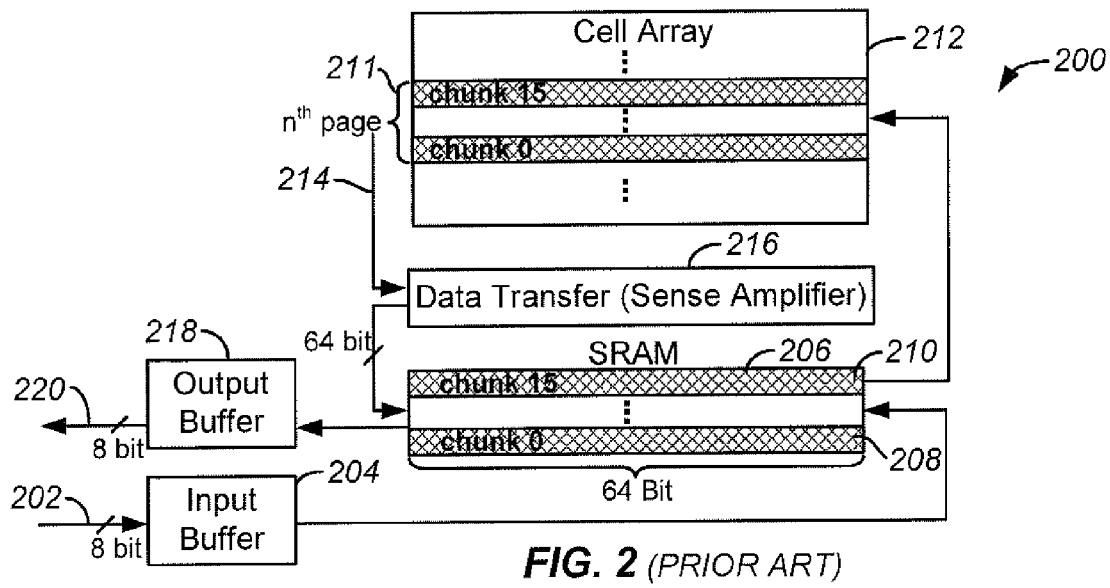
FIG. 2 is a diagram of a system illustrating a conventional program and read sequence.
Figure 3A:
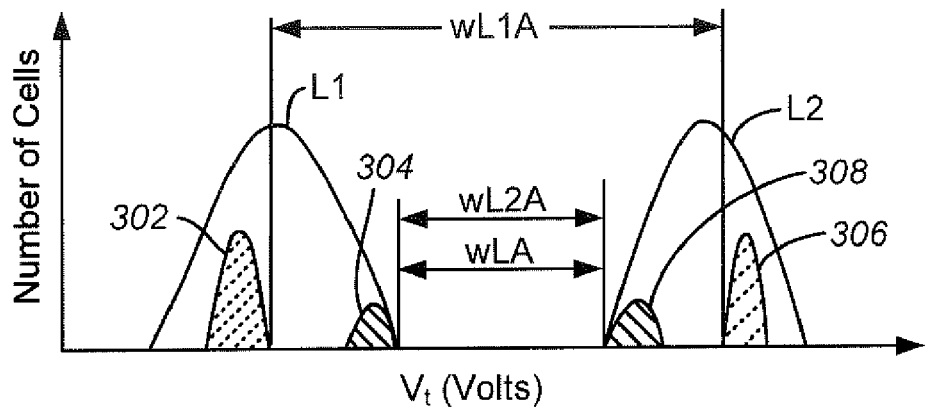
FIGS. 3A and 3B show a portion of the MLC Vth distribution for a page of an MLC memory array after programming, illustrating a problem addressed by embodiments of the invention.
Figure 3B:
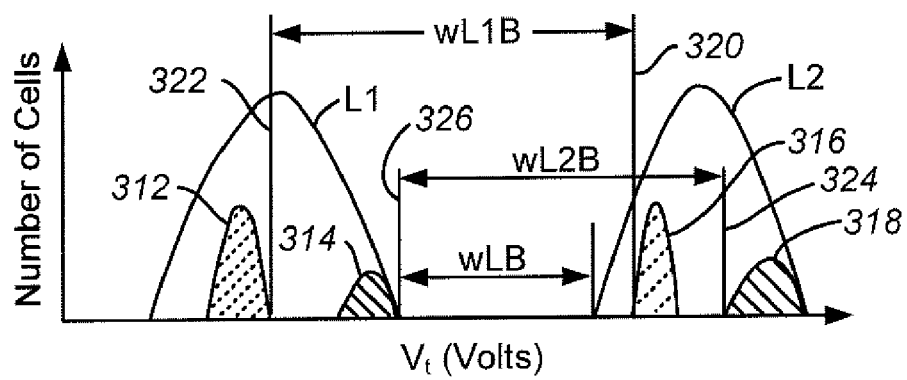

FIGS. 3A and 3B show a potion of the Vth distribution for a page of an MLC memory array after programming, illustrating a problem addressed by embodiments of the invention (compare with FIG. 1B). FIG. 3A shows the Vth distribution 302 for MLCs in a first chunk programmed to level L1, a distribution 304 in a second chunk programmed to level L1, a distribution 306 for the MLCs in the first chunk programmed to level L2, and a distribution 308 for the MLCs in the second chunk programmed to level L2. The read window WL1A between level L1 and level L2 in the first chunk is greater then the read window WL2A between level L1 and level L2 in the second chunk. Note that WL1A is greater than the read window WLA between the level L1 and level L2 distributions for the page (compare FIG. 1B), while WL2A is the same as WLA. The chip must be designed in prior art systems to handle the worst case represented by distributions 304 and 308, with a narrow read margin.

FIG. 3B shows the Vth distribution 312 for MLCs in a third chunk programmed to level L1, distribution 314 in a fourth chunk programmed to level L1, a distribution 316 for the MLCs in the third chunk programmed to level L2 and a distribution 318 for the MLCs in the second chunk programmed to level L2. The read widow WL1B between level L1 and level L2 in the third chunk is about the same as the read window WL2B between level L1 and level L2 in the fourth chunk. Note that both WL1B and WL2B are both greater than the read window WLB between the level L1 and level L2 distributions for the page (compare FIGS. 1B, 3A).

The condition shown in FIG. 3B can be utilized to advantage by dynamically adjusting the program-verify level 320 of level L2 for the third chunk based on the high boundary 322 of the level L1 Vth distribution 312 of the third chunk, and the program-verify level 324 for the fourth chunk is adjusted according to the high boundary 326 of the level L1 Vth distribution 314 of the fourth chunk, as each chunk is programmed and verified. Program-verify levels for level L3 and higher levels are similarly obtained. In particular embodiments, the program-verify levels are automatically adjusted during page/chunk programming. The read window for each chunk can be maintained at a constant value higher than available in the prior art, improving read performance of the array.

Figure 4:
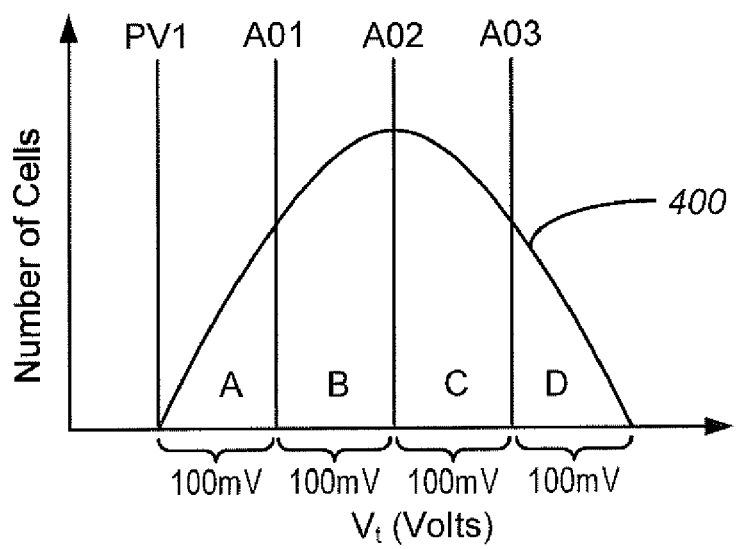
FIG. 4 shows a programming level distribution of a page of an MLC memory array split into sub-ranges.

FIG. 4 shows a Vt distribution 400 of cells in an MLC array or portion of an MLC array that have been programmed to a programming level (e.g. L1 or L2 of FIG. 3A or a higher programming level) split into four sub-ranges A, B, C, D. In this example, the distribution 400 for the programming level is about 400 mV and each sub-range is about 100 mV wide. For purposes of illustration and convenient discussion only, the L1 programming level having an L1 program-verify level PV1 will be used as an example. The number of sub-ranges that the Vt distribution is divided into will be referred to as "granularity" for purposes of convenient discussion. Thus, this example has a granularity of four. Higher granulation allows superior precision in determining and setting PV adjustments, but requires more evaluation and memory resources.

Each chunk having MLCs programmed to level L1 will have a chunk Vt distribution (see, e.g. FIG. 3A, ref. nums. 302, 304) that falls within the L1 Vt distribution 400. When program-verify is done for L1 MLCs in a chunk, the high boundary (i.e. the maximum Vt of an L1 MLC in that chunk) is detected and evaluated to determine which sub-range A, B, C, D the high boundary occurs in. An adjustment value (adjust code) is assigned to the chunk according to the sub-range the high boundary of the chunk L1 Vt distribution (see, e.g., FIG. 3A, ref. num. 302) occurs in. This adjustment value is used to adjust the program-verify low boundary level of the next-higher programming level (i.e. L2) of that chunk, and for read voltage adjustment.

For example, for a chunk Vt distribution high boundary falling in the first sub-range A, no adjustment is made to the L2 program-verify level for that chunk. If the high boundary of the L1 Vt distribution for a chunk falls within the second sub-range B, an AD1 level adjustment is made to increase the L2 program-verify level (low boundary of the L2 Vt distribution) for that chunk. If the high boundary falls within the third sub-range C, an AD2 level adjustment is made to increase the L2 low boundary level for that chunk even further, and so forth.

In a particular example, the Vt distributions for L1 and L2 programming levels are each about 400 mV and each sub-range is about 100 mV wide. If the high boundary of the L1 Vt distribution for a chunk falls in sub-range B, 100 mV will be added to the L2 program verify level for that chunk. In alternative embodiments, and depending on implementation details, the sub-ranges do not have to be the same width for different programming levels. Similarly, the adjustment voltage value for a higher programming level does not have to be the same as a corresponding sub-range width of the lower programming level. The Vt distribution 400 is alternatively split into more than four or fewer than four sub-ranges. A greater number of sub-ranges provides better resolution, but requires additional resources. Adjusting the PV level for a subsequent programming level of a chunk provides an improved read window between the programming levels of the chunk.

Figure 5:
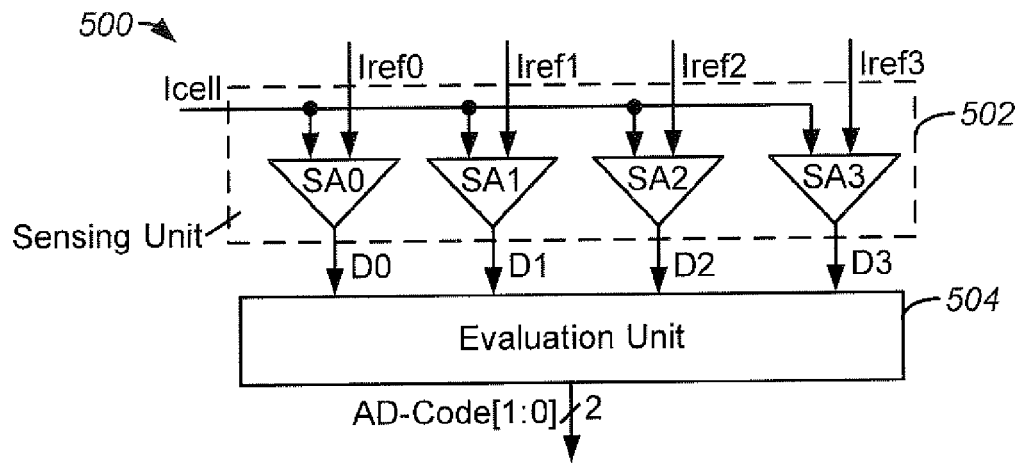
FIG. 5 shows a truth table for a page of MLC memory in an IC.

FIG. 5 is a circuit diagram of a program-verify ("PV") adjustment block 500 according to an embodiment of the invention. The PV adjustment block 500 has a sensing unit 502 and an evaluation unit 504. When a Vth is applied to an MLC, the cell current $I_{CELL}$ is provided to sense amplifiers SA0, SA1, SA2, SA3 in the sensing unit. Each sense amplifier compares $I_{CELL}$ to a reference current (e.g. $I_{REF0}$ for SA0, $I_{REF1}$ for SA1, $I_{REF2}$ for SA2, and $I_{REF3}$ for SA3). The reference currents are produced for example by reference cells pre-programmed during manufacturing to produce reference currents for each of the four boundary levels PV1, AD1, AD2 and AD3, shown in FIG. 4

If $I_{CELL}$ is greater than the reference current provided to a sense amplifier, the sense amplifier will output a first data value (e.g. "1"), and if $I_{CELL}$ is less than the reference current, the sense amplifier will output a second data value (e.g. "0"). (The assigned 0/1 data values are arbitrary, and alternatively, the first data value is 0 and the second data value is 1.)

For example, if the MLC threshold voltage after one program pulse is less than the page program-verify level (e.g. PV1 in FIG. 4), the data values D0, D1, D2, D3 from sense amplifiers SA0, SA1, SA2, SA3 are (1,1,1,1). If additional program pulses are applied that raise the threshold voltage of the MLC to sub-range C (see FIG. 4), the data values output from the sensing unit 502 are (0,0,0,1). When the MLC programming level L1 is detected, it will be located within sub-range A, B, C, or D Table 1 shows the output of the evaluation unit 504 for various data sets from the sensing unit 502:

TABLE 1

| D0 | D1 | D2 | D3 | Sub-range (see FIG. 4) | AD-Code [1:0] (see FIG. 5) |
|---|---|---|---|---|---|
| 1 | 1 | 1 | 1 | NA | 00 |
| 0 | 1 | 1 | 1 | A | 00 |

TABLE 1-continued

| D0 | D1 | D2 | D3 | Sub-range (see FIG. 4) | AD-Code [1:0] (see FIG. 5) |
|---|---|---|---|---|---|
| 0 | 0 | 1 | 1 | B | 01 |
| 0 | 0 | 0 | 1 | C | 10 |
| 0 | 0 | 0 | 0 | D | 11 |

Note that the AD code for data set (1,1,1,1) is the same as for data set (0,1,1,1). The data set (1, 1,1,1) indicates that the Vth for the MLC is below the PV for the page, and not successfully programmed.

The AD codes for the MLCs in a chunk are used to record the highest Vth sub-range for the chunk, so in this example of an MLC capable of being programmed to level L0, level L1, level L2, or level L3, we have six AD codes (two bits for each programming level above the lowest level of each chunk). For example, chunk 0 (see FIG. 8, ref. num. 808) has 128 Bytes (1K bits), and chunk 0 has six bits of AD code. Each chunk uses the highest AD code sensed for all the cells in the chunk. For example, if one MLC of chunk 2 is at sub-range C after a series of programming pulses applied to the chunk, and the other MLCs of chunk 2 are at or below sub-range C, the AD code of chunk 2 is 10 ("one-zero") indicating sub-range C. The AD code is used to set the program-verify level of the next programming level for that chunk. For example, if the AD code of programming level L1 for a chunk is 01 ("zero-one"), indicating a high boundary for the chunk distribution falling in the sub-range B of the page Vth distribution, then the program-verify level of programming level L2 for that chunk is set higher than the sub-range B boundary than the base page PV value (e.g. 200 mV higher) for L2.

The reference currents supplied to the sense amplifiers in the PV adjustment block 500 can be generated a variety of ways. For example, in a non-programmed cell approach, if the array cell word line equals 5 V, the word line level to activate reference cell 0 can be 4.4 V, with 0.6 V reserved for the read 0 window, the word line level to activate reference cell 1 would be 4.3 V (using the 100 mV example of FIG. 4); and the word line levels reference cell 2 and reference cell 3 would be 4.2 V and 4.1 V, respectively.

Alternatively, a programmed reference cell approach can be used. If the array cell word line is 5 V, the reference cell 0 word line level is 5 V, the reference cell 1 word line level is 4.9 V, the reference cell 2 word line level is 4.8 V, and the reference cell 3 word line level is 4.7 V. The reference cell Vth is 0.6 V higher than the page program verify level so that 0.6 V is kept for the read 0 window.

Figure 6:
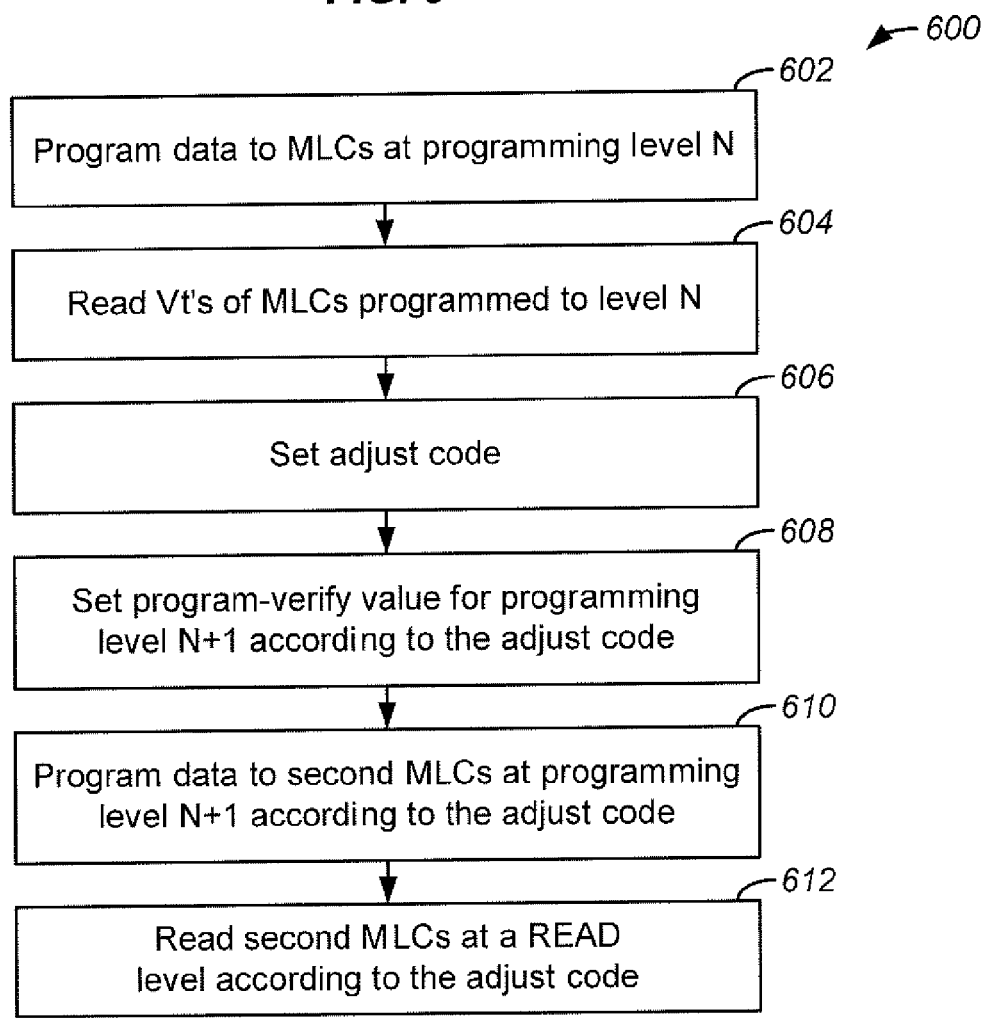
FIG. 6 is a flow chart illustrating a method of operating an MLC memory array of an IC according to an embodiment of the invention.

FIG. 6 is a flow chart illustrating a method 600 of operating an MLC memory array of an IC according to an embodiment of the invention. Data is programmed into an MLC bit array that is a portion of an MLC memory array (i.e. a first plurality of MLCs, such as a portion of a chunk of a page that is to be set at level L1) at a first programming level N, where N is an integer (step 602). In a particular embodiment, the MLC memory array (e.g. page) has a Vth (read voltage) distribution for programming level N divided into at least a first sub-range and a second sub-range. The threshold voltages Vth 's are sensed (read) for the MLCs in the bit array programmed to level N (step 604), and the Vth 's are used to set an adjust code (step 606). In one embodiment, the distribution of threshold voltages Vth for the bit array is narrower than Vth distribution for the MLC memory array, and has a high boundary (i.e., the highest Vth for any MLC in the bit array) that falls into the first sub-range or into the second sub-range of the Vth distribution for the MLC memory array. The adjust code is set according to the sub-range in which the high boundary of the Vth distribution for cells programmed to level L1 falls.

A program-verify value for programming level N+1 (e.g. "adjusted chunk PV N+1") is set according to the adjust code (step 608) determined from the Vth 's of programming level N. Referring to FIG. 4, the adjusted PV value is often greater than the PV1 value for the entire page programming level distribution 400, but could be the same as the PV1 level if no adjustment is needed for this level of this chunk. A second bit array of the MLC memory array (e.g. a second portion of the chunk) is programmed to level N+1 according to the adjusted chunk PV N+1, which is selected according to the adjust code (step 610). In this manner, the read margins between the threshold distributions for level N and level N+1 are maintained nearly constant as the program verify levels are dynamically shifted. In further embodiments, additional adjusted PV values are determined for additional programming levels (N+2, . . . N+M). In an exemplary embodiment, the bit array is a portion of the chunk, and the process is repeated for each chunk of a page, and then for each page, of an MLC memory device. In a further embodiment, a read level reference for a chunk of a page is set according to the adjust code (step 612), as well, to take advantage of the dynamically adjusted program verify levels.

Figure 7:
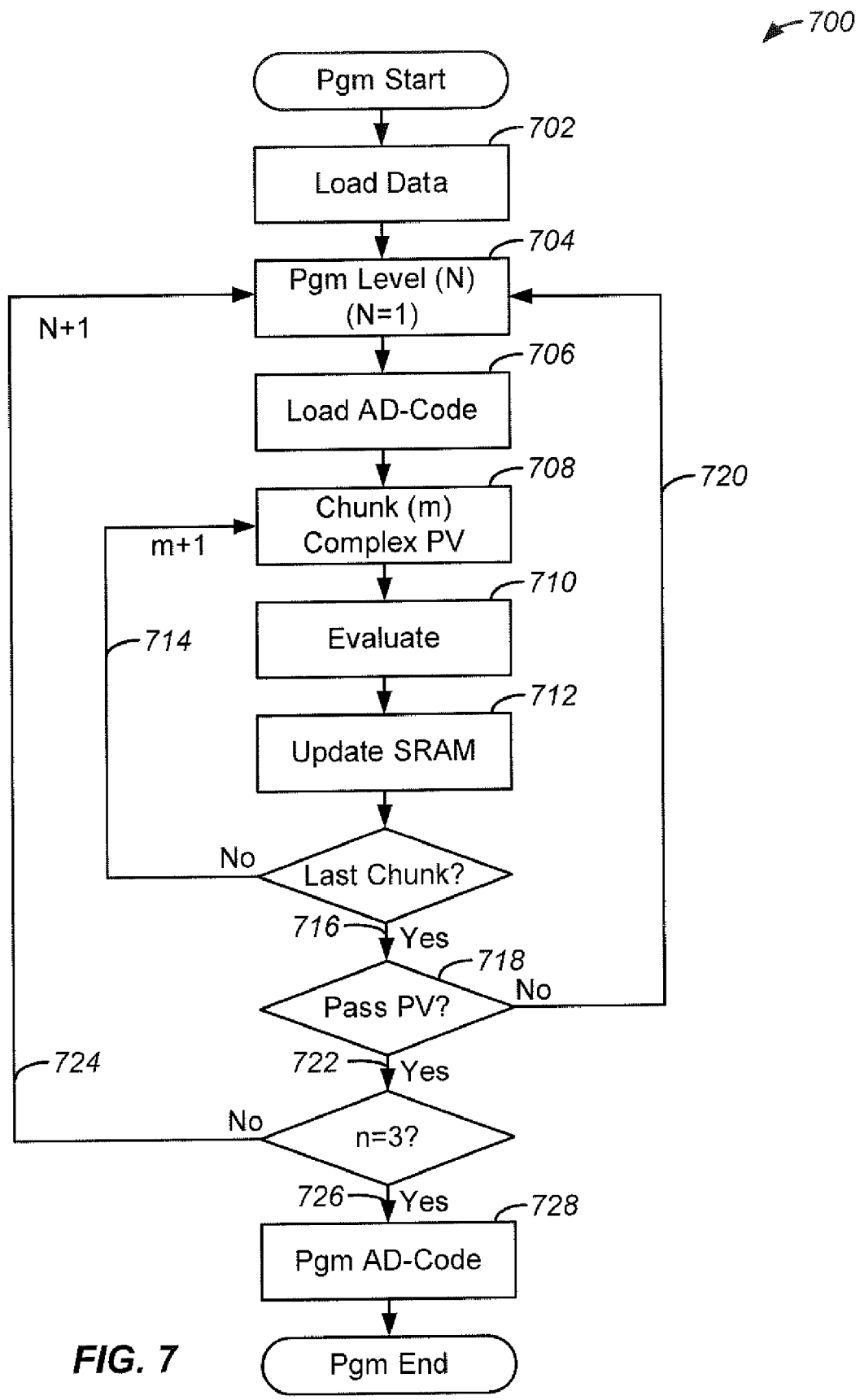
FIG. 7 is a flow chart of method of programming an MLC memory array according to an embodiment of the invention.

FIG. 7 is a flow chart of method 700 of programming an MLC memory array according to an embodiment of the invention. Data is loaded into a memory device (e.g. user data is read into an SRAM) (step 702). A portion of the loaded data is programmed into a first bit array at a first programming level N (e.g. L1) (step 704), which in a particular embodiment is a portion of a chunk (chunk (n)) of a page of the MLC memory array that is to be programmed to level N. An adjust code is loaded to a data transfer block (e.g. sense amplifiers 816 in FIG. 8) (step 706). In a particular embodiment, the default (initial) value of the adjust code is 00 (see Table 1). A complex PV operation is performed for chunk (m) level N (step 708). "Complex PV operation" means that the program-verify operation is performed using multiple references (see FIG. 5). The complex PV operation is evaluated (step 710) and the SRAM is updated with the data bit part (see FIG. 8, ref. nums. 806, 821) and the adjust code (AD code) part (see FIG. 8, ref. nums. 826, 828) (step 712). If there is another chunk to program at level N (branch 714), steps 708, 710, and 712 are repeated. When all chunks of the page have been programmed at level N (step 716), it is determining whether the PV operation passed or failed (step 718). If the page PV fails (branch 720), an additional programming pulse is applied, chunk by chunk, to the $N^{th}$ level MLCs in the page.

If the page passes page PV (branch 722) and there are additional levels to program (e.g. level L2 and L3) (branch 724), the program level is incremented (N+1) and steps 704 through 718 are repeated until the highest level (e.g. L3) has been programmed (branch 726). In a further embodiment, the adjust codes (AD codes) for the entire page (i.e. all of the AD codes for each programming level of each chunk) are stored (step 728). In a particular embodiment, the whole page AD code information is programmed to the memory array (see FIG. 8, ref num. 827) using a single-level cell method, which insures accurate reading of the AD codes in a later data read operation from the page.

Figure 8:
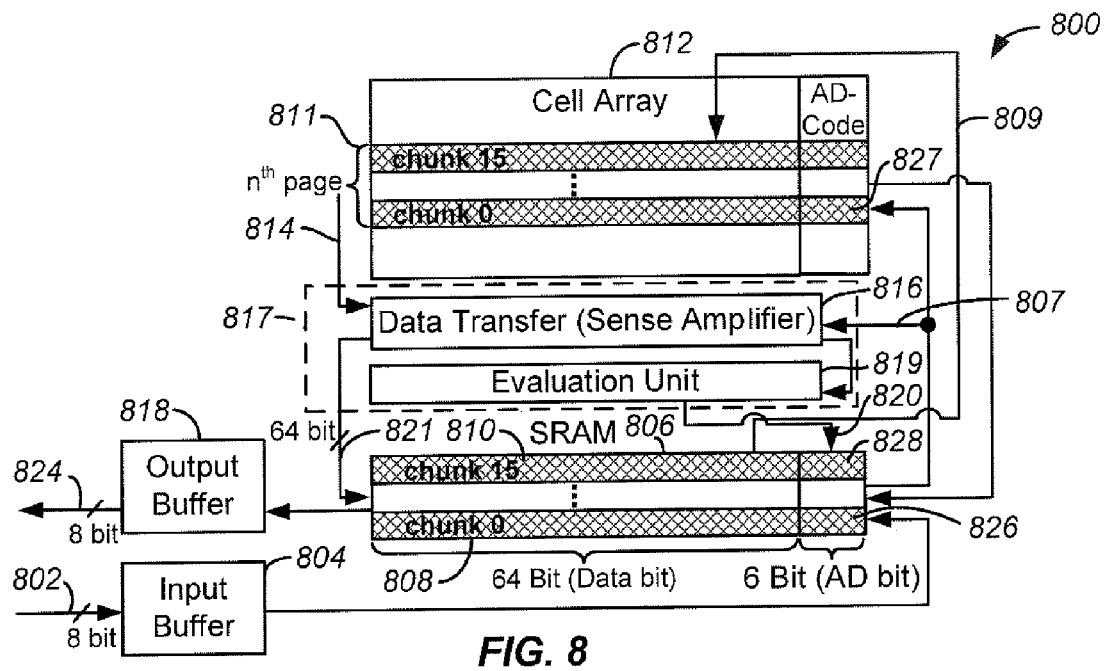
FIG. 8 is a diagram of an IC according to an embodiment of the invention.

FIG. 8 is a diagram of an IC, 800, according to an embodiment of the invention. A user enters a program pattern 802 into an input buffer 804. The program pattern is transferred into an SRAM buffer 806, which divides the program pattern (data) into chunks 808, 810 and further into segments and programs via line 809 the data bits to a page 811 of an MLC memory array 812. In a particular embodiment, the MLCs in a chunk are programmed to successive levels in a sequential fashion, in other words, some MLCs in the chunk are programmed to L1, then other MLCs in the chunk are programmed to L2, and then other MLCs in the chunk are programmed to L3. Some of the MLCs in the chunk are not programmed, and are at L0. In some embodiments, some chunks in the memory array do not have MLCs programmed to each possible level.

An initial AD code is loaded 807 to a data transfer block 816 (e.g. sense amplifier array) in a PV adjustment block 817 (see FIG. 5). After programming data into the MLC memory array 812, a complex program verify operation is performed by reading the programmed values back 814 using a data transfer block 816. The PV adjustment block 817 performs a complex PV operation (see FIG. 7, step 708) and provides a data set (e.g. D0, D1, D2, D3 in Table 1) to an evaluation unit 819. The evaluation unit determines an adjustment bit (AD code), which in a particular embodiment having a granularity of four in a four-level MLC array, is a 6-bit AD code. The sensed data (i.e. read results) 821 are updated to the SRAM buffer 806 and the AD code 820 is loaded to the SRAM buffer 806, and then the AD code (e.g. 826) in the SRAM buffer 806 is programmed to the memory cell array 812 (e.g. AD code 827). In a particular embodiment, the AD codes are programmed to the cell memory array based on a single-level cell method to enhance the reliability and accuracy of the AD code information when read back.

The read results during program verify should match the program pattern. If the program-verify operation fails, another programming pulse is applied to the MLCs in the segment until the programmed MLCs in the chunk are within the desired programming level range. Alternatively, all segments in a chunk are programmed before the segments are verified.

Referring to FIGS. 4 and 5, and Table 1, as a datum is read from a memory cell, the evaluation unit indicates whether the memory cell has been programmed to be within the desired programming level range (e.g., within the Vth distribution for a page, see FIG. 4, ref. num. 400). If the Vth level is below the desired programming level, an additional programming pulse is applied, followed by another data verify (read) operation. If Vth for the cell falls within the desired programming level range, the evaluation unit determines which sub-range of the Vth distribution the Vth for the programmed cell occurs in, and generates the corresponding AD code. As additional memory cells are read, the evaluation unit generates additional AD codes. The process is repeated for each segment of the chunk. Eventually, the highest AD code for the chunk (e.g. 827) is stored in cell array 812. The AD codes for each chunk are available to be read from the cell array 812.

The process is repeated until the whole page is programmed and verified. Several other sequences are possible, but generally, a chunk is programmed to a desired level (e.g. L1, see FIG. 1B) and verified to confirm that the programmed MLCs provide the desired levels when read. This is done for each chunk until the entire page passes program-verify, and then repeated for additional (higher) programming levels. Alternatively, each segment or chunk is programmed to all indicated levels before incrementing to the next segment or chunk.

During a read operation, the user obtains the page content by reading 814 the data stored in the MLC memory array 812. The segments are written into the SRAM buffer 806 until an entire chunk is read. The page data is delivered to an output buffer 818, and then the output data 824 is delivered to the user.

Figure 9:
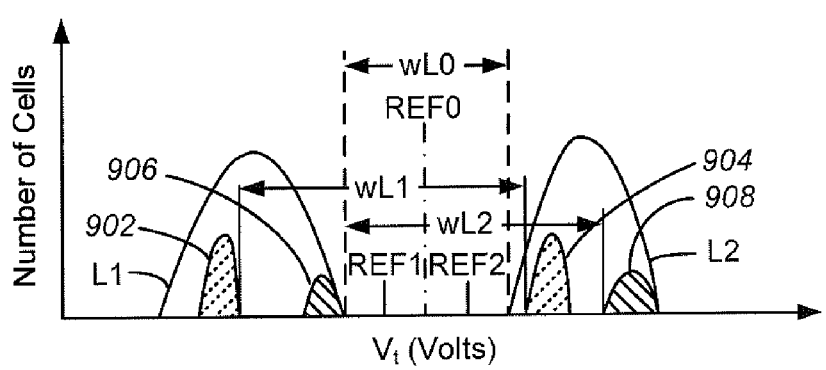
FIG. 9 shows a memory cell distribution versus Vth for an MLC memory array according to another embodiment of the invention.

FIG. 9 shows a memory cell distribution versus Vth for an MLC memory array according to another embodiment of the invention. A conventional read operation has a reference REF0 set between a first level L1 and a second level L2. A nominal read window WL0 is conventionally the separation between level L1 and L2, and the nominal reference voltage REF0 is typically set in the middle of window WL0.

A first chunk has a level L1 distribution 902 and a level L2 distribution 904. This provides a read window WL1 for the first chunk that is wider than window WL0. Similarly, the second chunk has a level L1 distribution 906 and a level L2 distribution 908 that provides a read window WL2 for the second chunk that is also wider than window WL0. Programming the chunks according to the AD code techniques described above provides enhanced (wider) read windows. The AD code between level L1 and level L2 for the first chunk is used to determine a reference REF1 when distinguishing between level L1 and level L2 from the first chunk, and the AD code between level L1 and level L2 for the second chunk is used to determine a reference REF2 when distinguishing between level L1 and level L2 from the second chunk. For purposes of convenient discussion, this is described as "dynamically moving" the reference according to the adjustment result of each chunk. The adjustment result is generated during the program phase, as described above, and may be higher REF2 or lower REF1 than the initial reference REF0.

The read operation from a user's perspective is typically page-based, which means the user can obtain the page content from the array as long as they execute a read command. The read operation from the view of the internal design is a sense amplifier number width-based. For example, 128 bit information will be obtained in the MLC system after each sensing pulse from 64 sense amplifiers. This number of sense amplifiers is merely exemplary, different numbers of sense amplifiers are alternatively used.

In a read operation according to an embodiment, the reference values are dynamically moved. Referring to FIG. 5, $I_{REF1}$, $I_{REF2}$ and $I_{REF3}$ are adjusted (moved) according to the AD code associated with the portion and programming level (s) of the MLC memory array being read.

Figure 10:
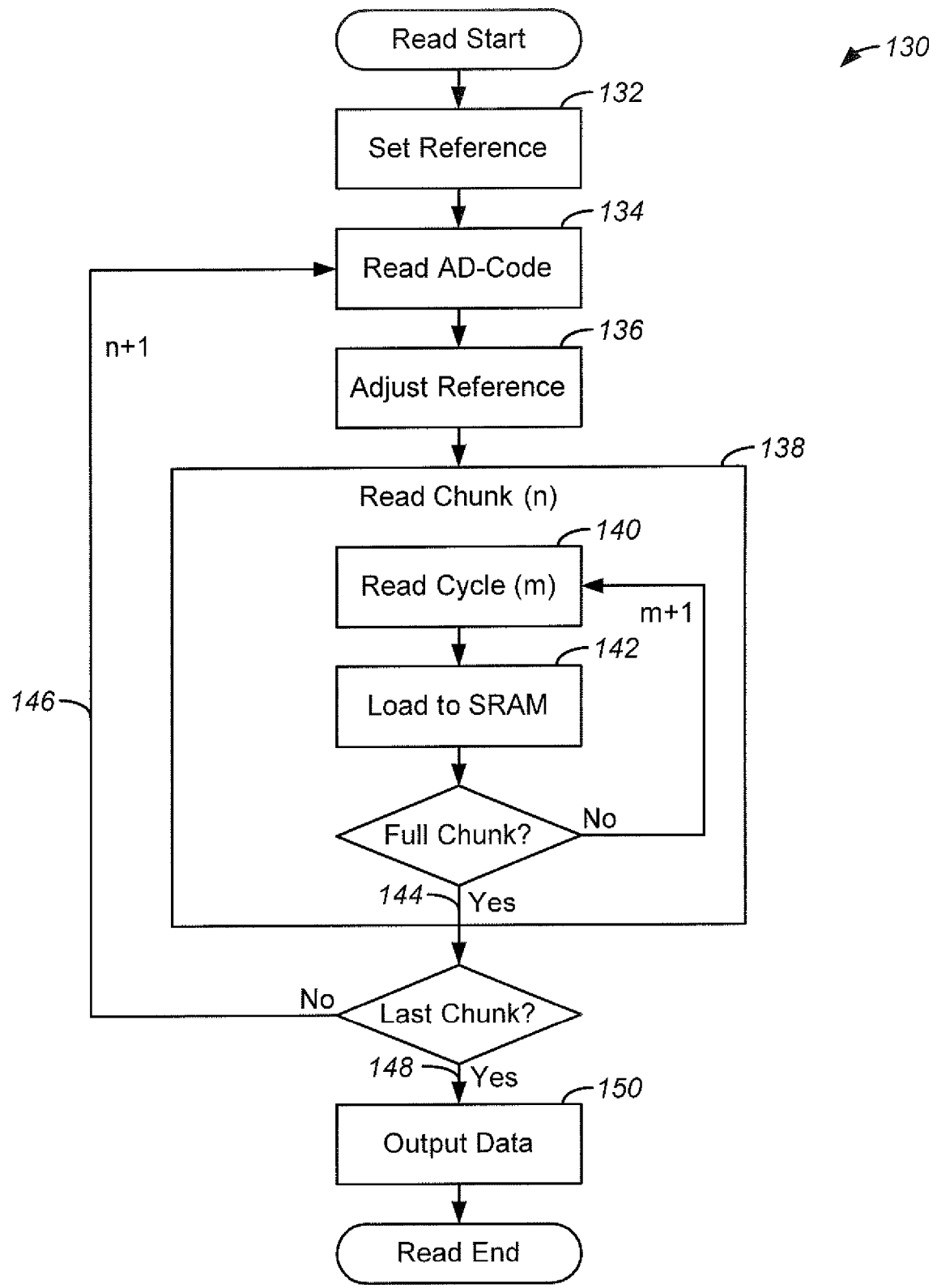
FIG. 10 is a flow chart of a read operation of an MLC memory array according to an embodiment.

FIG. 10 is a flow chart of a read operation 130 of an MLC memory array according to an embodiment. A default reference value is set (see, e.g., FIG. 9, REF0) (step 132). An AD code associated with a chunk is read (e.g. AD code 827 from the cell array 812 in FIG. 8) to SRAM (step 134) and the default reference value is adjusted to an adjusted reference value (see, e.g., FIG. 9, REF1) (step 136). Data is read from the chunk (step 138) using the adjusted reference value. In one embodiment, a number of read cycles (step 140) are performed and the data loaded to SRAM (step 142) until the full chunk (branch 144) has been read. If there is another chunk to read (branch 146), steps 134 through 138 are repeated until the last chunk has been read (branch 148). The data is output (step 150) from the SCAM to the user. In one embodiment an entire page is read and the data is sent to the user. Alternatively, a first portion of a page is read and sent to the user. In a further embodiment, a second portion of the page is read while the data from the first portion of the page is being sent to the user.

The reference value is adjusted in various embodiments by controlling a word line voltage applied to the read reference cells, or by providing a plurality of pre-set reference cells, and selected one of the plurality in response to the AD code. The techniques described herein are applied in SONOS-type multilevel memory cells, having non-conductive charge trapping structures, such as silicon oxide/silicon nitride/silicon oxide ONO gate dielectrics which trap charge in the silicon nitride layer, and variations of such charge trapping memory cells. See, Eitan et al., "4-bit per Cell NROM Reliability," Electron Devices Meeting, 2005. IEDM Technical Digest. IEEE International, Volume, Issue, Dec. 5, 2005 Page(s): 539-542.

Although the preferred embodiments involve charge trapping memory cells with non-conductive charge trapping structures, the technology is extended to floating gate memory cells that include conductive floating gates for capturing charge.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A method for operating a multi-level cell ("MLC") memory array of an integrated circuit ("IC") comprising:
   programming first data into a first plurality of MLCs in the MLC memory array at a first programming level;
   sensing threshold voltages for the first plurality of MLCs;
   setting an adjust code according to the read voltages; and
   programming second data into a second plurality of MLCs in the MLC memory array at a second programming level, the second plurality of MLCs having a program-verify value set according to the adjust code.

2. The method of claim 1 wherein the first plurality of MLCs is in a first chunk of a page of the MLC memory array and the second plurality of MLCs is in the first chunk.

3. The method of claim 1 further comprising steps of
   programming third data into a third plurality of MLCs in the MLC memory array at the first programming level;
   sensing second threshold voltages for the third plurality of MLCs;
   setting a second adjust code according to the second threshold voltages; and
   programming fourth data into a fourth plurality of MLCs in the MLC memory array at the second programming level, the fourth plurality of MLCs having a second program-verify value set according to the second adjust code.

4. The method of claim 3 wherein the plurality of MLCs is in a first chunk of a page of the MLC memory array, the second plurality of MLCs is in the first chunk, the third plurality of MLCs is in a second chunk of the page, and the fourth plurality of MLCs is in the second chunk.

5. The method of claim 1 further comprising a step of storing the adjust code in the MLC memory array.

6. The method of claim 5 wherein the adjust code is stored using a single-level cell technique.

7. The method of claim 5 wherein the first data is stored in a first chunk of the MLC memory array and the adjust code is stored in the first chunk.

8. The method of claim 1 wherein the first programming level is within a first page programming level range extending between a first program verify level and a first erase verify level, the first page programming level range being divided into sub-ranges, the threshold voltages for the first plurality of MLCs providing a first chunk threshold voltage distribution having a first high boundary occurring in a sub-range of the first page programming level range, the adjust code being set according to the sub-range.

9. The method of claim 8 wherein the first page programming level range is divided into four sub-ranges.

10. The method of claim 8 wherein a first sub-range of the first page programming level range has a first sub-range width and a second sub-range has the first sub-range width.

11. The method of claim 1 further comprising steps of
setting a first reference voltage according to the adjust code; and
reading the second plurality of MLCs using the first reference voltage.

12. The method of claim 3 further comprising steps of
setting a first reference voltage according to the adjust code;
reading the second plurality of MLCs using the first reference voltage;
setting a second reference voltage according to the second adjust code; and
reading the fourth plurality of MLCs using the second reference voltage.

13. The method of claim 1 further comprising steps of
sensing second threshold voltages for the second plurality of MLCs;
setting a second adjust code according to the second threshold voltages;
programming third data into a third plurality of MLCs in the MLC memory array at a third programming level, the third programming level having a second program-verify value set according to the second adjust code.

14. The method of claim 13 wherein the first plurality of MLCs, the second plurality of MLCs, and the third plurality of MLCs are in a chunk of a page of the MLC memory array.

15. The method of claim 13 wherein a chunk adjust code including the first adjust code and the second adjust code is stored in the MLC memory array.

16. The method of claim 13 wherein the chunk adjust code is stored using a single-level cell technique.

17. The method of claim 13 wherein the chunk adjust code is stored in the chunk.

18. The method of claim 1 wherein the program-verify value provides a first read window between the threshold voltages of the first plurality of MLCs and second threshold voltages of the second plurality of MLCs greater than a nominal read window between the first programming level and the second programming level.

19. The method of claim 3 wherein the program-verify value provides a first read window between the threshold voltages of the first plurality of MLCs and second threshold voltages of the second plurality of MLCs, and wherein the second program-verify value provides a second read window between the threshold voltages of the third plurality of MLCs and fourth threshold voltages of the fourth plurality of MLCs, each of the first read window and the second read window being greater than a nominal read window between a first programming level distribution and a second programming level distribution.

20. An integrated circuit ("IC") comprising:
a multi-level cell ("MLC") memory array; and
a program-verify adjustment block including
a plurality of sense amplifiers associated with a corresponding plurality of sub-ranges of a threshold voltage distribution of a programming level of the MLC memory array, and
an evaluation unit receiving a plurality of bits corresponding to the plurality of sense amplifiers, the evaluation unit providing an adjustment bit according to the plurality of bits.

21. The IC of claim 20 wherein the threshold voltage distribution has at least two sub-ranges and the plurality of sense amplifiers includes
a first sense amplifier coupled to a first reference indicating a program-verify boundary of the threshold voltage distribution,
a second sense amplifier coupled to a second reference indicating a first adjust level between a first sub-range and a second sub-range.

22. The IC of claim 20 wherein the threshold voltage distribution has four sub-ranges and the plurality of sense amplifiers includes
a first sense amplifier coupled to a first reference indicating a program-verify boundary of the threshold voltage distribution,
a second sense amplifier coupled to a second reference indicating a first adjust level between a first sub-range and a second sub-range,
a third sense amplifier coupled to a third reference indicating a second adjust level between the second sub-range and a third sub-range, and
a fourth sense amplifier coupled to a fourth reference indicating a third adjust level between the third sub-range and a fourth sub-range.

* * * * *